United States Patent
Brady et al.

(10) Patent No.: US 6,259,408 B1
(45) Date of Patent: Jul. 10, 2001

(54) RFID TRANSPONDERS WITH PASTE ANTENNAS AND FLIP-CHIP ATTACHMENT

(75) Inventors: Michael John Brady, Brewster; Dah-Weih Duan, Yorktown Heights, both of NY (US); Ravi F. Saraf, West Blacksburg, VA (US); Judith M. Rubino, Ossining, NY (US)

(73) Assignee: Intermec IP Corp., Woodland Hills, CA (US)

( * ) Notice: Subject to any disclaimer, the term of this patent is extended or adjusted under 35 U.S.C. 154(b) by 0 days.

(21) Appl. No.: 09/443,621

(22) Filed: Nov. 19, 1999

(51) Int. Cl.[7] ........................................ H01Q 1/38
(52) U.S. Cl. ........................ 343/700 MS; 343/795; 361/737
(58) Field of Search ............... 343/700 MS, 793, 343/795, 873; 361/728, 736, 737, 793, 794, 795

(56) References Cited

U.S. PATENT DOCUMENTS

| | | | |
|---|---|---|---|
| 3,945,014 | * | 3/1976 | Kunert et al. ................... 343/713 |
| 4,808,435 | | 2/1989 | Cropp et al. . |
| 5,128,685 | * | 7/1992 | Shinnai et al. .................. 343/713 |
| 5,313,366 | | 5/1994 | Gaudenzi et al. . |
| 5,315,753 | * | 5/1994 | Jensen et al. ..................... 29/600 |
| 5,448,110 | | 9/1995 | Tuttle et al. . |
| 5,847,931 | | 12/1998 | Gaumet et al. . |
| 5,945,957 | * | 8/1999 | Kakizawa ........................ 343/713 |
| 5,999,409 | * | 12/1999 | Ando et al. ..................... 361/737 |
| 6,011,698 | * | 1/2000 | Buehler ........................... 361/799 |

FOREIGN PATENT DOCUMENTS 0 615 285   9/1994   (EP) .

* cited by examiner

*Primary Examiner*—Tho Phan
(74) *Attorney, Agent, or Firm*—O'Melveny & Myers LLP

(57) ABSTRACT

A radio frequency transponder is provided which comprises a substrate layer, a radio frequency integrated circuit affixed to said substrate layer; and an antenna provided on said substrate layer in electrical connection with said radio frequency integrated circuit. The antenna is comprised of a conductive paste material having a resistivity of approximately 20 $\mu\Omega$-cm., which is greater than the resistivity of a conventional etched copper antenna, but still sufficiently low to provide a radio frequency transponder having acceptable read range. The substrate layer further comprises a flexible organic material. The radio frequency integrated circuit is disposed in a flip-chip configuration facing downward toward said substrate layer, with electrical contacts aligned with the antenna.

24 Claims, 4 Drawing Sheets

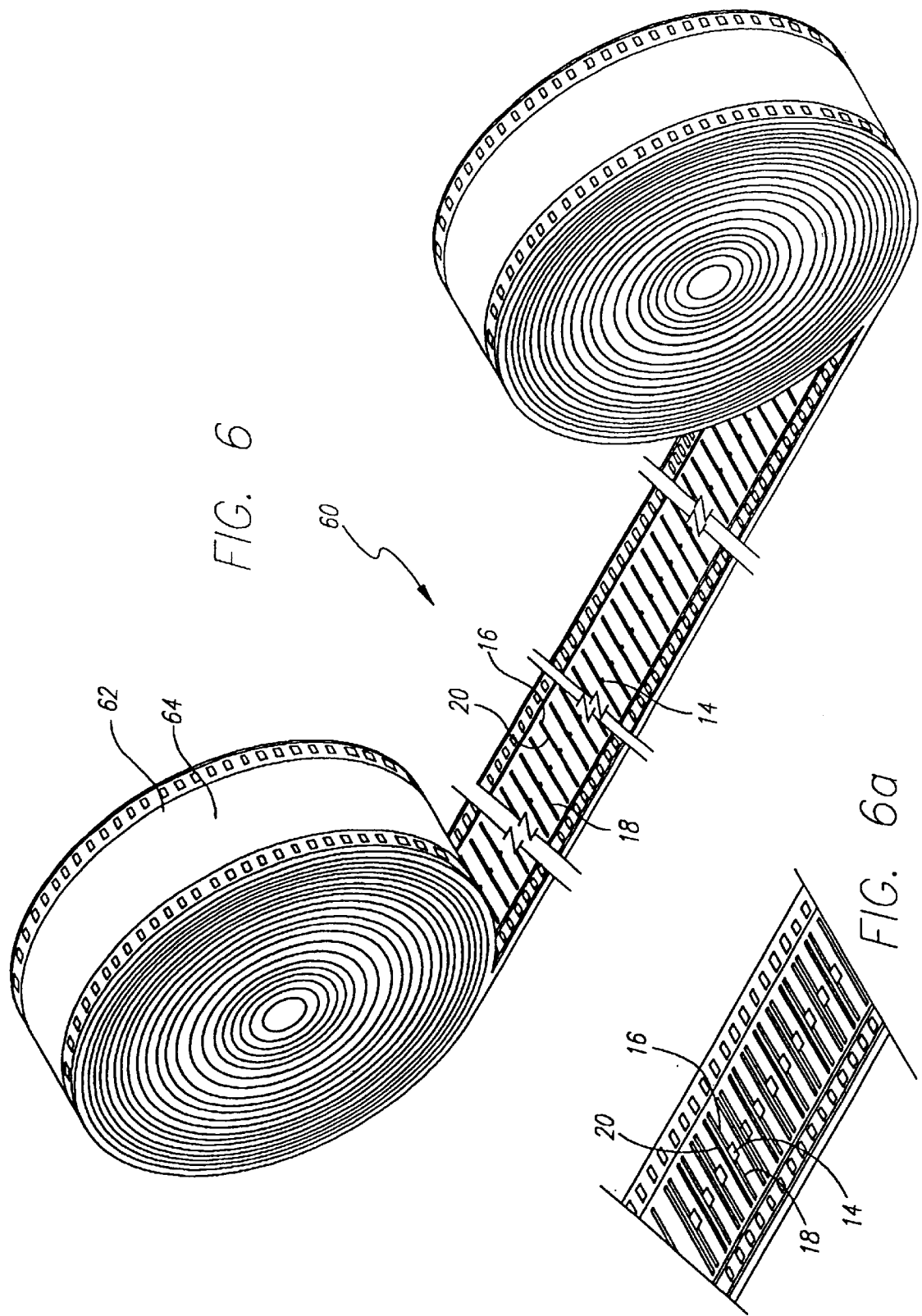

US 6,259,408 B1

RFID TRANSPONDERS WITH PASTE ANTENNAS AND FLIP-CHIP ATTACHMENT

BACKGROUND OF THE INVENTION

1. Field of the Invention

The present invention relates generally to radio frequency systems such as radio frequency identification (RFID) systems, and more specifically to RFID transponders having patterned metal used to form an antenna fabricated of a screened conductive paste.

2. Description of Related Art

In the automatic data identification industry, the use of RFID transponders (also known as RFID tags) has grown in prominence as a way to track data regarding an object to which an RFID transponder is affixed. An RFID transponder generally includes a semiconductor integrated circuit having a memory in which information may be stored. An RFID interrogator containing a transmitter-receiver unit is used to query an RFID transponder that may be at a distance from the interrogator. The RFID transponder detects the interrogating signal and transmits a response signal containing encoded data back to the interrogator. RFID systems are used in applications such as inventory management, security access, personnel identification, automotive toll collection, and vehicle identification, to name just a few.

Such RFID systems provide certain advantages over conventional optical indicia recognition systems (e.g., bar code symbols). For example, the RFID transponders have a memory capacity of several kilobytes or more, which is substantially greater than the maximum amount of data that may be contained in a typical one-dimensional bar code symbol. The RFID memory may be re-written with new or additional data, which would not be possible with a printed bar code symbol. Moreover, RFID transponders may be readable at a distance without requiring a direct line-of-sight view by the interrogator, unlike bar code symbols that must be within a direct line-of-sight and which may be entirely unreadable if the symbol is obscured or damaged. An additional advantage of RFID systems is that the interrogator may read several RFID transponders at one time.

Conventional RFID transponders are fabricated using a direct chip attach (DCA) process in which an integrated circuit chip is interconnected on a substrate such as a printed circuit board or an organic flexible substrate such as polyimide or Mylar. The chip is electrically connected to metallic traces formed on the substrate using various techniques, such as wire bonding, tape automated bonding or solder bumping. The metallic traces are generally formed using a photolithographic process in which a desired pattern is selectively etched into a copper layer laminated onto the substrate. Signal delay to and from the chip is thereby minimized because the distance between the chip and the metallic traces of the substrate is kept to a minimum due to the elimination of the chip package and corresponding internal interconnects. The DCA process is a generally cost-effective packaging technique since the chip is assembled directly onto the substrate without enclosing the chip in a separate package; however, the photolithographic process used to form the metallic traces is most expensive part of the process. There is great commercial interest in reducing the cost of RFID transponders to make the technology more price competitive with other automatic data identification technologies, such as bar code symbology.

Accordingly, it would be desirable to provide a more cost-effective process for fabricating RFID transponders. It would be further desirable to provide an alternative way to fabricate metallic traces on a substrate.

SUMMARY OF THE INVENTION

In accordance with the teachings of the present invention, a radio frequency transponder is provided which comprises a substrate layer, a radio frequency integrated circuit affixed to said substrate layer; and an antenna provided on said substrate layer in electrical connection with said radio frequency integrated circuit. The antenna is comprised of a conductive paste material having a resistivity of approximately 20 $\mu\Omega$-cm., which is greater than the resistivity of a conventional etched copper antenna, but still sufficiently low to provide a radio frequency transponder having acceptable read range. The substrate layer further comprises a flexible organic material. The radio frequency integrated circuit is disposed in a flip-chip configuration facing downward toward said substrate layer, with electrical contacts aligned with the antenna.

To fabricate the radio frequency transponder, a desired antenna pattern is screened onto the substrate layer using the conductive paste material. The conductive paste material further comprises silver particles loaded into a polymer binder with a solvent. The conductive paste material is extruded onto the substrate layer through a screening mask. Then, the patterned conductive paste is soft baked by driving the solvent out of the conductive paste to leave the silver particles in a polymer matrix. The radio frequency integrated circuit is optically aligned to the antenna pattern and bonded to the substrate layer using a conductive adhesive by applying heat and pressure between the radio frequency integrated circuit and the substrate layer for a predetermined period of time. The bond pressure and temperature thereby causes the conductive paste to become fully cured.

A more complete understanding of the RFID transponders with conductive paste antennas and flip-chip attachment will be afforded to those skilled in the art, as well as a realization of additional advantages and objects thereof, by a consideration of the following detailed description of the preferred embodiment. Reference will be made to the appended sheets of drawings that will first be described briefly.

BRIEF DESCRIPTION OF THE DRAWINGS

FIG. 6 is an isometric view of a manufacturing process used to fabricate the RFID transponders of FIG. 1 onto a roll of flexible tape; and FIG. 6A is an enlarged portion of the flexible tape of FIG. 6.

DETAILED DESCRIPTION OF THE PREFERRED EMBODIMENT

The present invention satisfies the need for a cost-effective process for fabricating RFID transponders. In the detailed description that follows, like element numerals are used to describe like elements illustrated in one or more of the figures.

Figure 1:
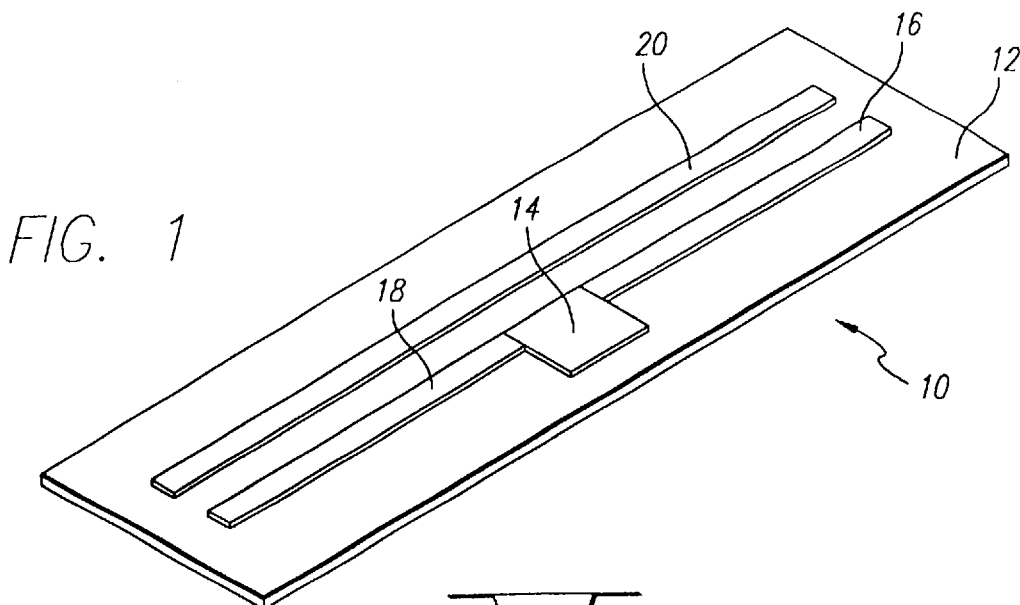
FIG. 1 is an isometric view of an RFID transponder having a conductive paste dipole antenna fabricated in accordance with the present invention.

Referring first to FIG. 1, an RFID transponder 10 fabricated in accordance with the present invention is illustrated. The RFID transponder 10 comprises a generally rectangular substrate 12 with a radio frequency identification integrated circuit (RFID IC) 14 mounted thereon. The substrate 12 may be comprised of a flexible organic material, such as polyimide, polyester and the like, or alternatively may be comprised of rigid material such as ceramic. The RFID IC 14 is coupled to an antenna circuit comprising dipole elements 16, 18 and an impedance adjustment element 20. The antenna circuit allows the RFID transponder 10 to sense an interrogating field provided by an RFID interrogator (not shown), and to transmit a response to the RFID interrogator. As known in the art, the RFID transponder 10 may transmit a response by modulating the impedance match between the RFID IC and the antenna circuit to thereby reflect the interrogating field in a communication method referred to as backscatter modulation. The RFID IC 14, antenna dipole elements 16, 18 and impedance adjustment element 20 may be coated with an encapsulant, such as a "glob-top" or an "under-fill" epoxy, or the like, and/or laminated so that they are protected from damage due to environmental contaminants or handling.

Figure 2:
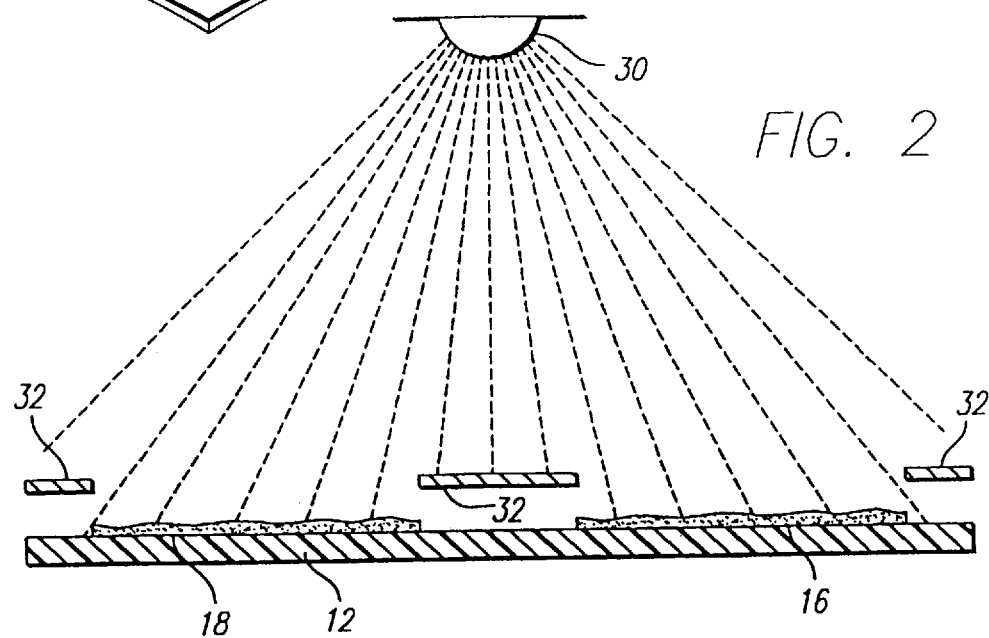
FIG. 2 is a side sectional view of a substrate having a conductive paste dipole antenna screened thereon.

Referring now to FIGS. 2, 3A–3C and 4A–4C, a process for manufacturing RFID transponders is shown. In FIG. 2, the substrate 12 is screened or printed with a conductive paste to fabricate the dipole elements 16, 18 and impedance adjustment element 20. A screening mask 32 has openings that correspond to the desired antenna circuit pattern for the RFID transponder 10. The screening mask 32 may be comprised of a fine mesh or metal material. The screening mask 32 is placed over the substrate 12 and aligned with the substrate so that the openings are oriented in a desired configuration. A nozzle 30 disposed over the screening mask 32 is adapted to extrude the conductive paste material onto the screening mask so that a portion of the conductive paste passes through the openings of the screening mask and onto the substrate 12. The conductive paste thereby forms the antenna circuit, including the dipole elements 16, 18. The nozzle 30 will continue to extrude the conductive paste until a desired thickness of material is provided on the substrate 12.

In an embodiment of the invention, the conductive paste is comprised of silver particles loaded into a polymer resin binder in a solvent. The solvent allows the highly silver-loaded paste to be screen printed with appropriate viscosity and sufficient shelf life. The silver particle distribution must stay within a certain particle size range for consistent properties and yet be small enough to pass through the finest mesh of the screening mask 32. After the conductive paste has been screened onto the substrate 12, the substrate is soft baked at a temperature of approximately 70° C. until the conductive paste has a generally tacky consistency. The substrate 12 is then ready for flip-chip bonding to the RFID IC 14.

Figure 3A:
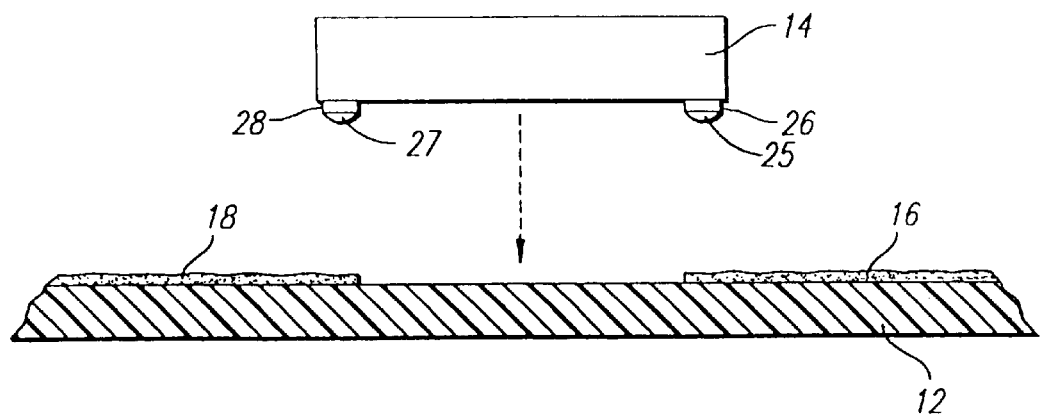
FIGS. 3A–3C illustrate a side sectional view of the RFID transponder of FIG. 1 through various stages of fabrication.
Figure 3B:
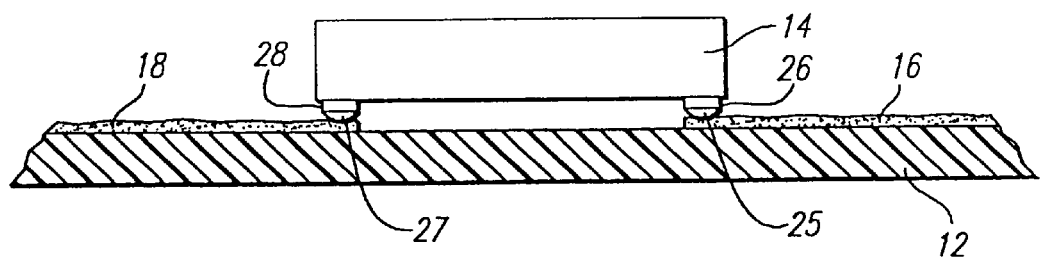
Figure 3C:
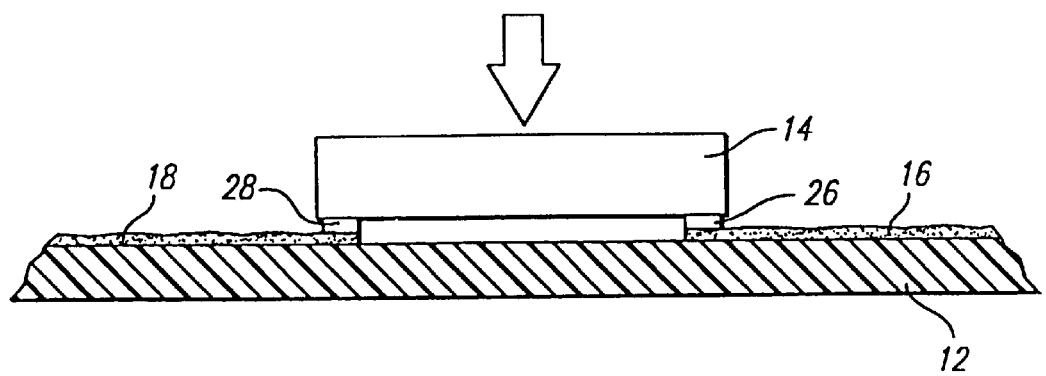

In FIGS. 3A–3C, the RFID IC 14 is coupled to the antenna circuit formed on the substrate using a flip-chip technique. As shown in FIG. 3A, the RFID IC 14 is flipped upside down, with the upper surface of the chip facing downward toward the upper surface of the substrate 12. The RFID IC 14 has contact pads 26, 28 comprised of conductive material such as copper coated with an oxide-free metal such as gold. The contact pads 26, 28 are electrically connected to the RF front end of the transponder circuitry. Bumps 25, 27 are formed on the contact pads 26, 28, respectively, from a soft metal material such as gold or solder. The bumps 25, 27 are aligned to the contact pads 26, 28, respectively, such as using an optical alignment system as is generally known in the art. In FIG. 3B, the RFID IC 14 is moved toward the substrate until the bumps 25, 27 stick into the conductive paste antenna elements 16, 18, respectively. In FIG. 3C, heat and/or pressure (depicted by the large arrow) is applied for a predetermined period of time to bond the RFID IC 14 to the substrate 12 and cure the conductive paste antenna elements 16, 18 at the same time. In the process, the bumps 25, 27 melt and become part of the cured antenna elements 16, 18.

In the process of curing, the solvent is driven out of the polymer resin binder, leaving the polymer resin matrix and the silver particles. The bonding time of the conductive adhesive material may range from three to ten minutes depending on the inertia of the heating elements. The assembled RFID transponder 10 may be further encapsulated or laminated, as described above. Optimum conductivity of the silver particles requires that substantially all of the solvent be driven out of the polymer resin binder. Even though silver is a better electrical conductor than copper, the electrical current passing through the antenna elements 16, 18 passes through thousands of silver particles and their associated mechanical junctions, thereby adding resistance to the antenna elements. A conductive paste produced in accordance with the foregoing description was approximately ten times more resistive than copper (i.e., on the order of 20 $\mu\Omega$-cm versus 2 $\mu\Omega$-cm). Nevertheless, such conductivity is still deemed acceptable for RFID transponder applications.

Figure 4A:
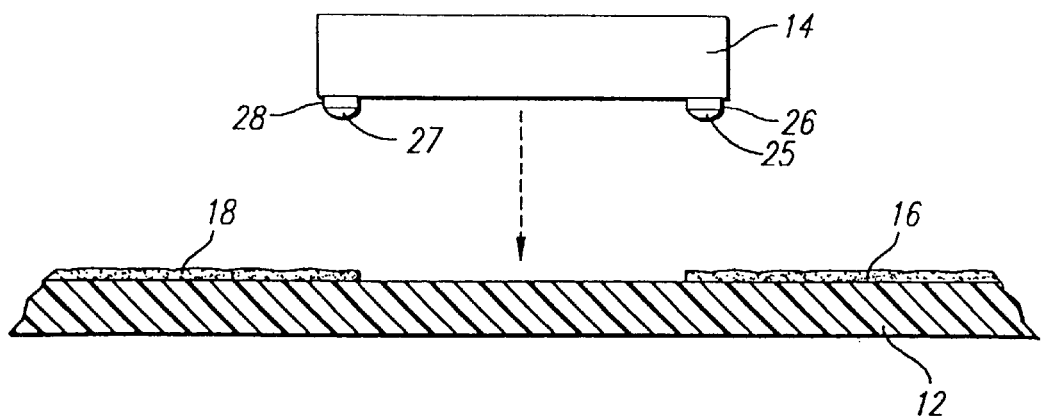
FIGS. 4A–4C illustrate a side sectional view of the RFID transponder of FIG. 1 through various alternative stages of fabrication.
Figure 4B:
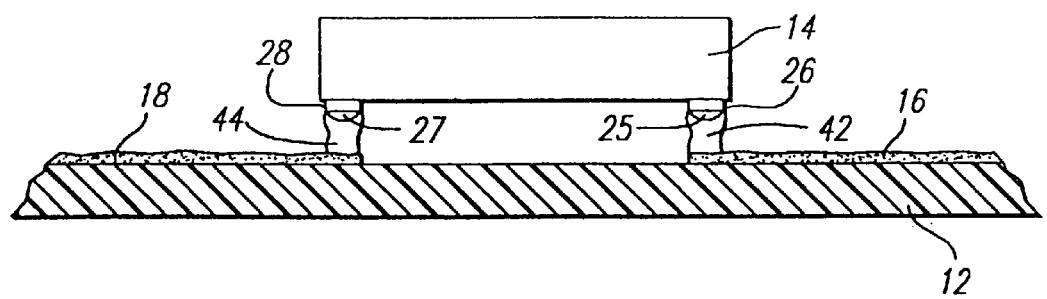
Figure 4C:
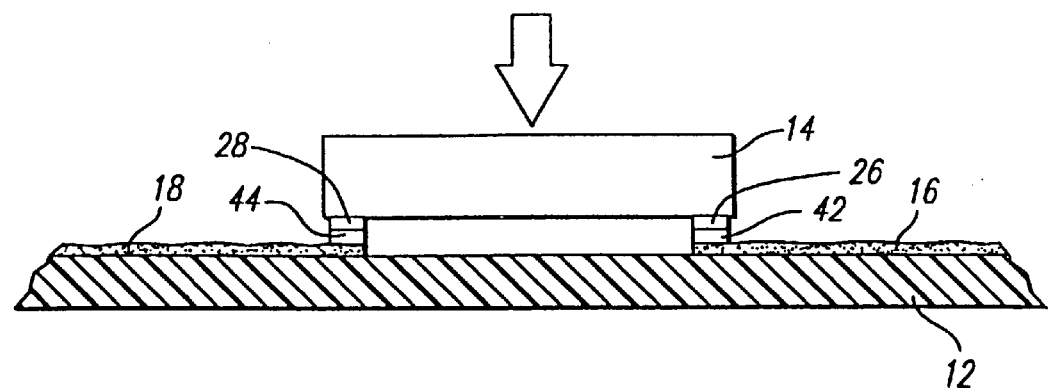

FIGS. 4A–4C illustrate an alternative fabrication method that may be utilized if it is desired to increase the spacing between the RFID IC 14 and the substrate 12. As shown in FIG. 4A, the RFID IC 14 is flipped upside down, with the upper surface of the chip facing downward toward the upper surface of the substrate 12. The RFID IC 14 has contact pads 26, 28 and bumps 25, 27 formed thereon in the same manner as described above. In FIG. 4B, a conductive adhesive 42, 44 is applied to the antenna elements 16, 18 in alignment with the bumps 25, 27. The RFID IC 14 is moved toward the substrate until the bumps 25, 27 stick into the conductive adhesive 42, 44, respectively. In FIG. 4C, heat and/or pressure (depicted by the large arrow) is applied for a predetermined period of time to bond the RFID IC 14 to the substrate 12 and cure the conductive paste antenna elements 16, 18 at the same time. The conductive adhesive 42, 44 compresses to form conductive elements provided between the contact pads 26, 28 and the antenna elements 16, 18.

Figure 5:
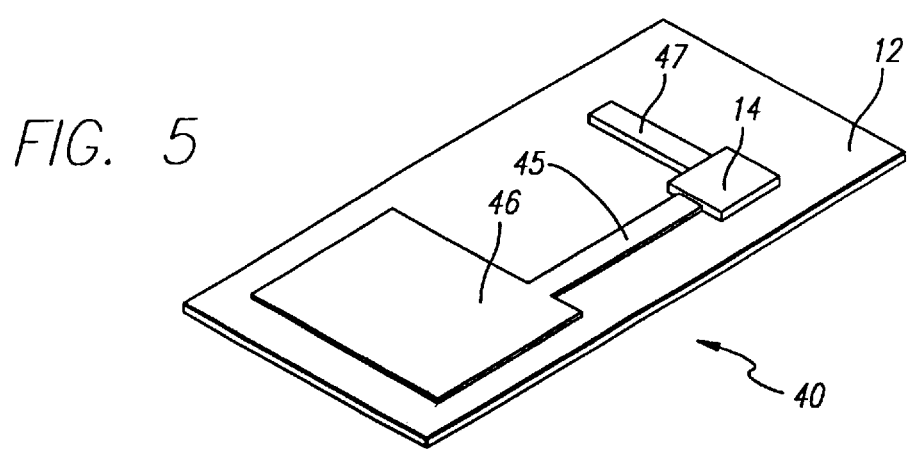
FIG. 5 is a perspective view of an alternative embodiment of an RFID transponder having a conductive paste patch antenna fabricated in accordance with the present invention.

Referring now to FIG. 5, an alternative embodiment of an RFID transponder 40 fabricated in accordance with the present invention is illustrated. As in the embodiment of FIG. 1, the RFID transponder 40 comprises a generally rectangular substrate 12 with a radio frequency identification integrated circuit (RFID IC) 14 mounted thereon. The RFID IC 14 is coupled to an antenna circuit comprising a patch antenna 46, an impedance matching element 48, and a tuning element 47. The antenna circuit is fabricated using conductive paste in the same manner as described above with respect to FIG. 1. It should be appreciated that a wide variety of other antenna circuit configurations or geometries (e.g., dipole, folded dipole, loop, coil, spiral, meander, patch, etc.) could be fabricated depending on the particular requirements of the application in which the RFID transponder is to be used.

FIG. 6 illustrates a roll of flexible tape or film 60 used for the fabrication of RFID transponders in accordance with the process described above. The tape 60 may comprise polyimide material 64 having linearly arrayed sprocket holes 62 formed along outer edges thereof. Polyimide material has an advantageous ability to withstand elevated temperatures that may result from bonding of the RFID IC 14 thereto or the curing of the conductive adhesive or conductive paste. During the fabrication of RFID transponders, the tape 60 may be processed completely end-to-end in a repeated manner. For example, in a first pass through the tape 60, the antenna circuit including dipole elements 16, 18 and impedance tuning element 20 may be formed from conductive paste in the manner described above. In a subsequent pass through the tape 60, the RFID ICs 14 may be aligned to the antenna circuit and bonded using heat and pressure as described above. Lastly, in a final pass through the tape 60, an over-laminate layer 66 may be applied to seal the RFID transponders. Thereafter, the individual RFID transponders may be separated from the tape 60. An enlarged portion of the tape 60 illustrated at FIG. 6A shows several RFID transponders having antenna elements 16, 18, impedance tuning element 20 and RFID IC 14.

An exemplary RFID transponder fabricated in accordance with the present invention demonstrated a read range of 70 cm with a 2.45 GHz interrogating signal. By comparison, an RFID transponder fabricated using a convention tape automated bonding process with a flexible substrate demonstrated a read range of 95 cm, and an RFID transponder fabricated using a direct chip attach process with a printed circuit board demonstrated a read range of 90 cm. Although there is a slight degradation of the read range due to the increased resistivity of the conductive paste antenna circuit, the demonstrated read range is nevertheless acceptable for RFID applications in which reduced read range can be tolerated with the attendant benefit of reduced cost.

Having thus described a preferred embodiment of an RFID transponder with conductive paste antennas and flip-chip attachment, it should be apparent to those skilled in the art that certain advantages of the foregoing system have been achieved. It should also be appreciated that various modifications, adaptations, and alternative embodiments thereof may be made within the scope and spirit of the present invention. The invention is further defined by the following claims.

What is claimed is:

1. A radio frequency transponder, comprising:
   a substrate layer;
   a radio frequency integrated circuit disposed in a flip-chip configuration affixed to said substrate layer facing downward toward said substrate layer; and
   an antenna provided on said substrate layer in electrical connection with said radio frequency integrated circuit, said antenna being comprised of a conductive paste material.

2. The radio frequency transponder of claim 1, wherein said conductive paste further comprises silver particles loaded into a polymer binder.

3. The radio frequency transponder of claim 2, wherein said conductive paste has a resistivity of approximately 20 $\mu\Omega$-cm.

4. The radio frequency transponder of claim 1, wherein said substrate layer further comprises a flexible organic material.

5. The radio frequency transponder of claim 1, wherein said antenna further comprises a dipole antenna.

6. The radio frequency transponder of claim 5, wherein said radio frequency integrated circuit further comprises electrical contacts aligned with said dipole antenna.

7. The radio frequency transponder of claim 1, wherein said antenna further comprises a patch antenna.

8. The radio frequency transponder of claim 1, wherein said radio frequency integrated circuit further comprises electrical contacts aligned with said antenna.

9. The radio frequency transponder of claim 1, wherein said radio frequency integrated circuit further comprises a radio frequency identification integrated circuit.

10. A method for fabricating a radio frequency transponder comprises the steps of:
    providing a substrate layer;
    screening an antenna pattern onto said substrate layer using a conductive paste material;
    aligning a radio frequency integrated circuit to said antenna pattern; and
    bonding said radio frequency integrated circuit to said substrate layer by applying heat and pressure between said radio frequency integrated circuit and said substrate layer for a predetermined period of time.

11. The method of claim 10, wherein said screening step further comprises extruding said conductive paste material onto said substrate layer through a screening mask.

12. The method of claim 10, wherein said screening step further comprises screening a dipole antenna pattern using said conductive paste material.

13. The method of claim 10, wherein said screening step further comprises screening a patch antenna pattern using said conductive paste material.

14. The method of claim 10, wherein said aligning step further comprises flipping over said radio frequency integrated circuit so that it faces toward said substrate layer.

15. The method of claim 10, wherein said aligning step further comprises optically aligning said radio frequency integrated circuit to said antenna.

16. The method of claim 10, wherein said aligning step further comprises forming contact points of said antenna in alignment with corresponding contact pads of said radio frequency integrated circuit.

17. The method of claim 10, wherein said substrate layer is provided in a continuous manner.

18. A method for fabricating a radio frequency transponder comprises the steps of:
    providing a substrate layer:
    screening an antenna pattern onto said substrate layer using a conductive paste material;
    aligning a radio frequency integrated circuit to said antenna pattern; and
    bonding said radio frequency integrated circuit to said substrate layer by curing said conductive paste material, wherein said bonding step further comprises curing said conductive material.

19. The method of claim 18, wherein said conductive paste material further comprises silver particles loaded into a polymer binder with a solvent, and said curing step further comprises driving said solvent out of said conductive paste to leave said silver particles in a polymer matrix.

20. The method of claim 18, wherein said aligning step further comprises orienting said radio frequency integrated circuit so that an upper surface thereof faces toward said substrate layer.

21. A method for fabricating a radio frequency transponder comprises the steps of:
    providing a substrate layer;
    screening an antenna pattern onto said substrate layer using a conductive paste material;
    aligning a radio frequency integrated circuit to said antenna pattern; and bonding said radio frequency integrated circuit to said substrate layer by using a conductive adhesive, wherein said bonding step further comprises bonding said antenna to contact pads of said radio frequency integrated circuit using a conductive adhesive.

22. The method of claim 21, wherein said aligning step further comprises orienting said radio frequency integrated circuit so that an upper surface thereof faces toward said substrate layer.

23. A radio frequency transponder, comprising:
a substrate layer;
a radio frequency integrated circuit affixed to said substrate layer; and
a dipole antenna provided on said substrate layer in electrical connection with said radio frequency integrated circuit, said antenna being comprised of a conductive paste material.

24. The radio frequency transponder of claim 23, wherein said radio frequency integrated circuit further comprises electrical contacts aligned with said dipole antenna.

* * * * *